US012411177B2

(12) United States Patent
Sun et al.

(10) Patent No.: US 12,411,177 B2
(45) Date of Patent: Sep. 9, 2025

(54) METHOD FOR BATTERY CAPACITY ESTIMATION, ELECTRONIC APPARATUS, AND STORAGE MEDIUM

(71) Applicant: DONGGUAN NVT TECHNOLOGY LIMITED, Dongguan (CN)

(72) Inventors: Yaqing Sun, Dongguan (CN); Zhifeng Wang, Dongguan (CN); Dandan Lu, Dongguan (CN)

(73) Assignee: DONGGUAN NVT TECHNOLOGY LIMITED, Dongguan (CN)

( * ) Notice: Subject to any disclaimer, the term of this patent is extended or adjusted under 35 U.S.C. 154(b) by 170 days.

(21) Appl. No.: 18/325,333

(22) Filed: May 30, 2023

(65) Prior Publication Data

US 2023/0305069 A1    Sep. 28, 2023

Related U.S. Application Data

(63) Continuation of application No. PCT/CN2020/132355, filed on Nov. 27, 2020.

(51) Int. Cl.
*G01R 31/367* (2019.01)
*G01R 31/36* (2020.01)
(Continued)

(52) U.S. Cl.
CPC ....... *G01R 31/367* (2019.01); *G01R 31/3648* (2013.01); *G01R 31/387* (2019.01); *H01M 10/425* (2013.01); *H01M 10/48* (2013.01)

(58) Field of Classification Search
None
See application file for complete search history.

(56) References Cited

U.S. PATENT DOCUMENTS

2016/0033582 A1*  2/2016  You .............. G01R 31/367
324/426

FOREIGN PATENT DOCUMENTS

CN    103778280 A    5/2014
CN    104656021 A    5/2015
(Continued)

OTHER PUBLICATIONS

ISR for International Application PCT/CN2020/132355 mailed Sep. 1, 2021.
(Continued)

*Primary Examiner* — Jas A Sanghera
(74) *Attorney, Agent, or Firm* — WHDA, LLP

(57) ABSTRACT

A method of battery capacity estimation including: obtaining a charging current, charging voltage, charging time, and charging voltage interval of a battery being estimated; determining a charging current interval and a charging time interval based on the charging current, the charging voltage, and the charging time, where the charging current interval and the charging time interval correspond to the charging voltage interval; obtaining training features for model training, where the training features include training electrochemical features and training time domain features; determining actual features of the battery being estimated based on the charging voltage interval, the charging current interval, the charging time interval, and the training features, where the actual features include actual electrochemical features and actual time domain features; and estimating, based on the model and the actual features, an actual capacity of the battery being estimated.

15 Claims, 7 Drawing Sheets

(51) Int. Cl.
*G01R 31/387* (2019.01)
*H01M 10/42* (2006.01)
*H01M 10/48* (2006.01)

(56) References Cited

FOREIGN PATENT DOCUMENTS

| CN | 109031153 A | 12/2018 |
|---|---|---|
| CN | 110146822 A | 8/2019 |
| CN | 110320473 A | 10/2019 |
| CN | 110398697 A | 11/2019 |
| CN | 110703112 A | 1/2020 |
| CN | 111103544 A | 5/2020 |
| CN | 111579993 A | 8/2020 |
| KR | 101982120 B1 | 5/2019 |

OTHER PUBLICATIONS

Written Opinion for International Application PCT/CN2020/132355 mailed Sep. 1, 2021.
Office Action dated Jul. 15, 2024, issused in counterpart CN application No. 202080025619.1, with English translation (17 pages).
Office Action dated Nov. 20, 2024, issued in counterpart CN application No. 202080025619.1, with English translation (18 pages).
Extended European Search Report dated Jan. 18, 2024, issued in counterpart application No. 20962935.1 (8 pages).
Zhou Di et al.; "Reasearch on online estimation of available capacity of lithium batteries based on daily charging data", Journal of Power Sources, Elsevier, Amesterdam, NL, vol. 451, Jan. 20, 2020, XP086055219. (8 pages) cited in EESR dated Jan. 18, 2024.

\* cited by examiner

METHOD FOR BATTERY CAPACITY ESTIMATION, ELECTRONIC APPARATUS, AND STORAGE MEDIUM

CROSS REFERENCE TO RELATED APPLICATIONS

This application is a continuation application of PCT/CN2020/132355, filed on Nov. 27, 2020, the disclosure of which is hereby incorporated by reference in its entirety.

TECHNICAL FIELD

This application relates to the field of battery technology, and in particular to a method for battery capacity estimation, an electronic apparatus, and a storage medium.

BACKGROUND

The accuracy of battery capacity estimation for lithium-ion batteries is high at the early stage of use. However, with the aging of the cells of lithium-ion batteries, the accuracy of battery capacity estimation decreases continuously, which may lead to a jump change in the capacity displayed by an electronic apparatus and may even cause the electronic apparatus to shut down directly when the displayed capacity is 20% to 30%. At present, battery capacity can be estimated by using complete experimental cycling data. Although this method can improve the accuracy of battery capacity estimation, it requires a large amount of data and may take a large amount of time.

SUMMARY

In view of this, it is necessary to provide a method for battery capacity estimation, an electronic apparatus, and a storage medium that can reduce the amount of data required and shorten the estimation time.

An embodiment of this application provides a method for battery capacity estimation. The method includes: obtaining a charging current, charging voltage, charging time, and charging voltage interval of a battery being estimated; determining a charging current interval and a charging time interval based on the charging current, the charging voltage, and the charging time, where the charging current interval and the charging time interval correspond to the charging voltage interval; obtaining training features for model training, where the training features include training electrochemical features and training time domain features; determining actual features of the battery being estimated based on the charging voltage interval, the charging current interval, the charging time interval, and the training features, where the actual features include actual electrochemical features and actual time domain features; and estimating, based on the model and the actual features, an actual capacity of the battery being estimated.

According to some embodiments of this application, the model is a Gaussian process regression model.

According to some embodiments of this application, a difference between a maximum charging voltage and a minimum charging voltage in the charging voltage interval is less than or equal to 0.1 volts.

According to some embodiments of this application, the determining actual features of the battery being estimated based on the charging voltage interval, the charging current interval, the charging time interval, and the training features includes:

determining a charged capacity of the battery being estimated based on a charging current in the charging current interval and a charging time in the charging time interval;

determining a capacity increment value based on a charging voltage in the charging voltage interval and the charged capacity; and determining actual features of the battery being estimated based on a charging current in the charging current interval, a charging voltage in the charging voltage interval, a charging time in the charging time interval, the capacity increment value, and the training features.

According to some embodiments of this application, prior to the obtaining training features for model training, the method further includes:

determining total training features under different cycle numbers based on charging currents, charging voltages, and charging times of a standard battery under different cycle numbers and the charging voltage interval, where the total training features include total training electrochemical features and total training time domain features;

determining first total features under different cycle numbers, where the first total features under different cycle numbers are total training features under different cycle numbers whose linear correlations on actual capacities of the standard battery under different cycle numbers are greater than a predetermined value; and determining the training features based on the first total features under different cycle numbers.

According to some embodiments of this application, the total training electrochemical features include activation energy increment, throughput, and charging time length; the total training time domain features include peak value, maximum value, mean value, variance, root mean square value, peak factor, kurtosis, kurtosis factor, waveform factor, pulse factor, margin factor, minimum value, and skewness factor.

According to some embodiments of this application, prior to the determining the training features based on the first total features under different cycle numbers, the method further includes:

transforming the total training features under different cycle numbers into second total features under different cycle numbers using principal component analysis;

the determining the training features based on the first total features under different cycle numbers includes:

determining common features between the first total features under different cycle numbers and the second total features under different cycle numbers as third total features under different cycle numbers; and determining the training features for model training to be the third total features.

According to some embodiments of this application, the method further includes:

obtaining initial parameters generated in training the model using charging currents, charging voltages, and charging times of a standard battery under different cycle numbers;

obtaining first features by which the initial parameters are generated, where the first features include first electrochemical features and first time domain features;

replacing least dependent features among the first features with second features determined by using charging currents, charging voltages, and charging times of the battery being estimated in actual use under different cycle numbers, where the second features include second electrochemical features and second time domain features; and updating the initial parameters with the updated first features to obtain the model trained.

According to some embodiments of this application, the obtaining first features by which the initial parameters are generated includes:

obtaining first features by which the initial parameters are generated under a first quantity of cycle numbers;

the replacing least dependent features among the first features with second features determined by using charging currents, charging voltages, and charging times of the battery being estimated in actual use under different cycle numbers includes:

determining second features under a second quantity of cycle numbers based on the first features and the charging currents, charging voltages, and charging times of the battery being estimated in actual use under different cycle numbers;

determining correlations under the second quantity of cycle numbers, where the correlations under the second quantity of cycle numbers are smallest correlations among correlations of the second features under the second quantity of cycle numbers and the first features under the first quantity of cycle numbers; and using the second features under the second quantity of cycle numbers to replace features that are among the first features under the first quantity of cycle numbers and corresponding to the correlations under the second quantity of cycle numbers.

An embodiment of this application provides an electronic apparatus, where the electronic apparatus includes:

a battery;

a processor; and a memory, where the memory stores a plurality of program modules, and the plurality of program modules are loaded by the processor to execute the method for battery capacity estimation according to any one of the above.

An embodiment of this application provides a storage medium having at least one computer instruction stored thereon, where the instruction is loaded by a processor to execute the method for battery capacity estimation according to any one of the above.

The method for battery capacity estimation, electronic apparatus, and storage medium provided in embodiments of this application reduce the amount of data required and shorten the estimation time by using less data to implement capacity estimation for the battery being estimated via a Gaussian process regression model based on the test electrochemical features and test time domain features generated based on the charging voltage interval of the battery being estimated, the charging current interval corresponding to the charging voltage interval, and the charging time interval corresponding to the charging voltage interval.

REFERENCE SIGNS OF MAIN COMPONENTS

Electronic apparatus 100
Memory 11
Processor 12
Battery being estimated 13
Analog-to-digital converter 14
Timer 15

DETAILED DESCRIPTION

The following clearly and completely describes technical solutions in some embodiments of this application with reference to the accompanying drawings in some embodiments of this application. Apparently, the described embodiments are only some but not all of the embodiments of this application.

All other embodiments obtained by persons of ordinary skill in the art based on the embodiments of this application without creative efforts shall fall within the protection scope of this application.

Figure 1:
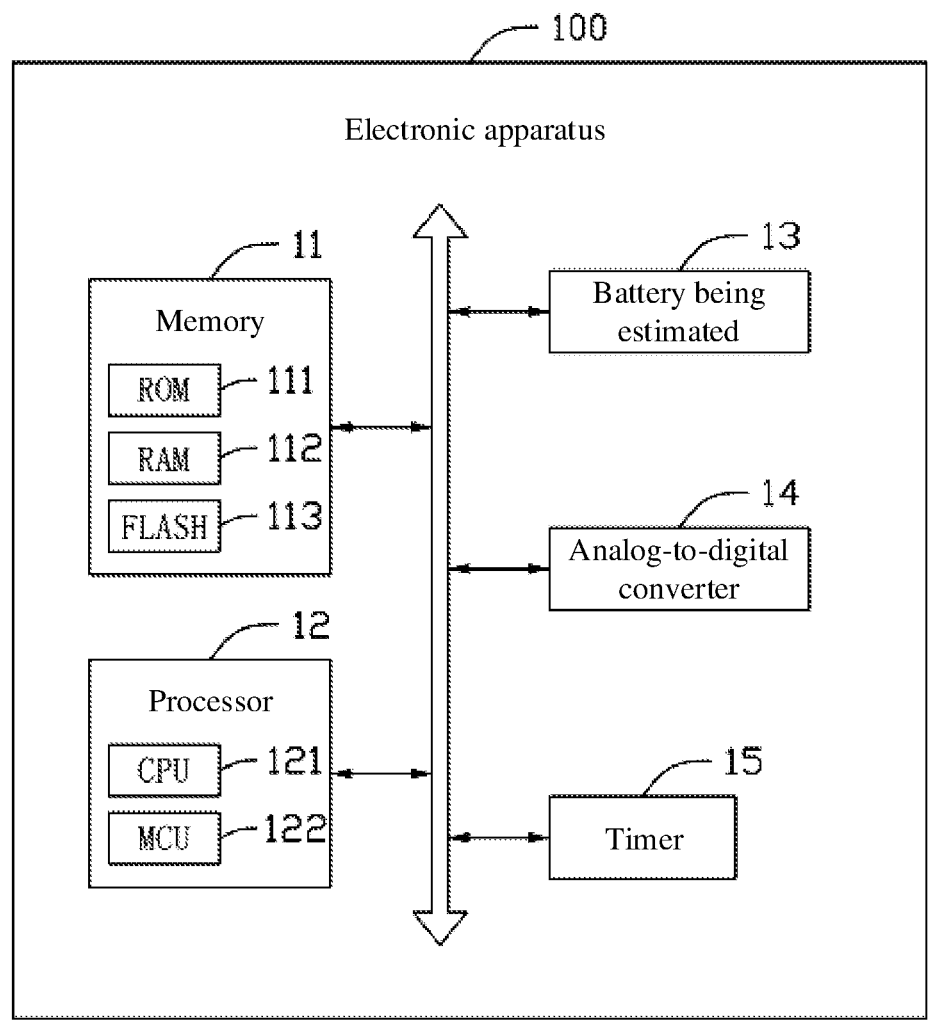
FIG. 1 is a schematic diagram of an electronic apparatus according to an embodiment of this application.

Referring to FIG. 1, FIG. 1 is a schematic diagram of an electronic apparatus according to an embodiment of this application. The electronic apparatus 100 includes but is not limited to a memory 11, at least one processor 12, a battery 13 being estimated, an analog-to-digital converter 14, and a timer 15. These components may be connected to each other via a bus or connected directly.

It should be noted that FIG. 1 is only an example for description of the electronic apparatus 100. In other embodiments, the electronic apparatus 100 may instead include more or fewer components or have a different configuration of components. The electronic apparatus 100 may be an electric motorcycle, an electric bicycle, an electric car, a cell phone, a tablet, a digital assistant, a personal computer, or any other suitable rechargeable device.

In one embodiment, the battery 13 being estimated is a rechargeable battery for providing electrical power to the electronic apparatus 100. For example, the battery 13 being estimated may be a lead-acid battery, a nickel-cadmium battery, a nickel-metal hydride battery, a lithium-ion polymer battery, a lithium polymer battery, and a lithium iron phosphate battery, or the like. The battery 13 being estimated is logically connected to the processor 12 via a battery management system (BMS), so that functions such as charging and discharging are realized via the battery management system. The battery management system may be connected to a power conversion system (PCS) via CAN or RS485 for communication. The battery 13 being estimated includes a cell, and the battery being estimated may be charged repeatedly in a cyclable rechargeable manner.

In this embodiment, the analog-to-digital converter 14 is configured to measure a charging voltage and a charging current of the cell of the battery 13 being estimated during a charging process. The timer 15 is configured to record a charging time of the cell of the battery 13 being estimated during a charging process. It can be understood that the electronic apparatus 100 may also include other apparatuses such as a pressure sensor, a light sensor, a gyroscope, a hygrometer, and an infrared sensor.

Figure 2:
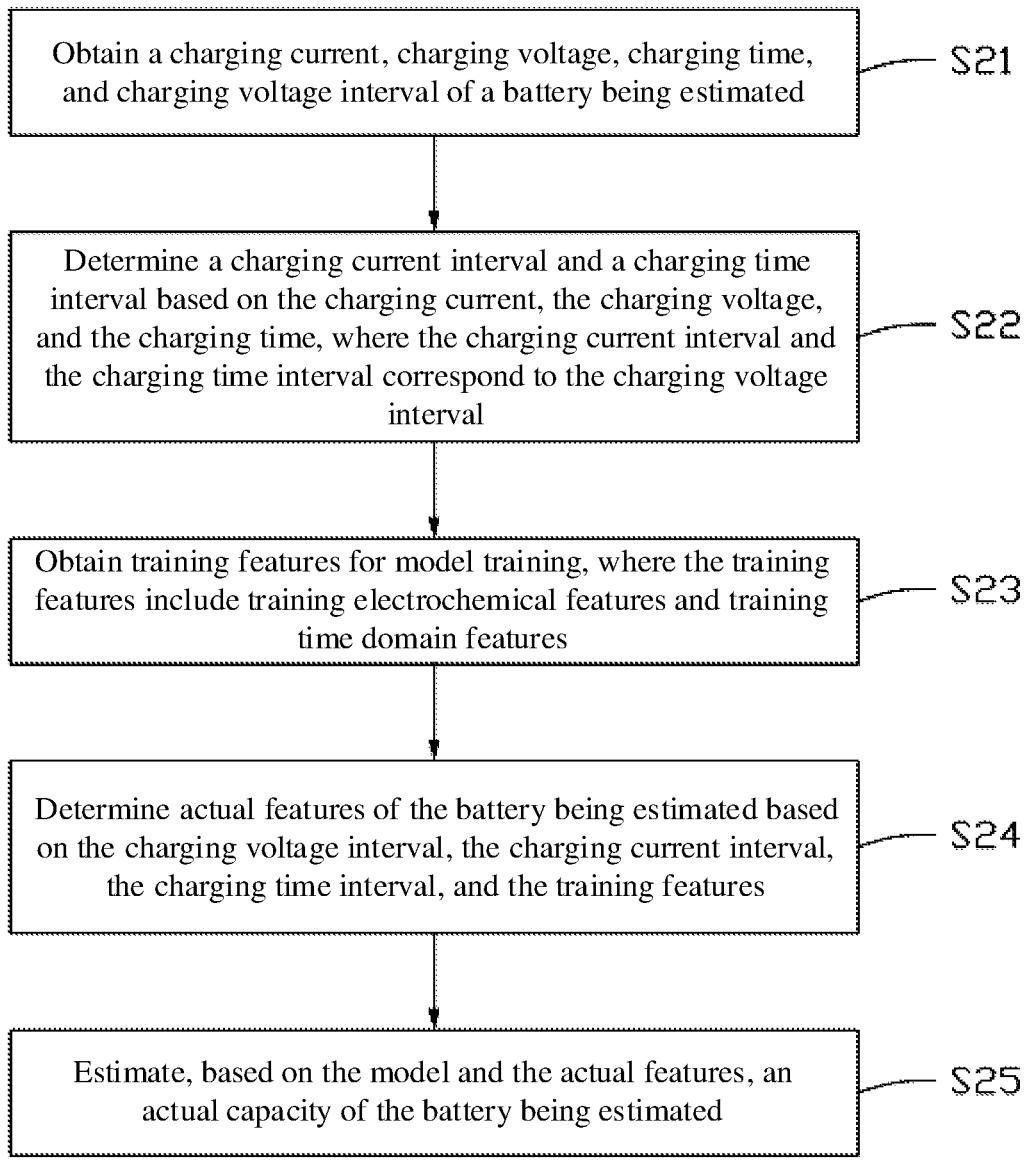
FIG. 2 is a flowchart of a method for battery capacity estimation according to an embodiment of this application.

Referring to FIG. 2, FIG. 2 is a flowchart of a method for battery capacity estimation according to an embodiment of this application. The method for battery capacity estimation is applied to a battery being estimated. The method for battery capacity estimation includes the following steps:

S21: Obtain a charging current, charging voltage, charging time, and charging voltage interval of a battery being estimated.

In this embodiment, the charging current and the charging voltage may be obtained by the analog-to-digital converter. The charging time may be obtained by the timer. The charging current, charging voltage and charging time are a charging current, charging voltage and charging time of the battery being estimated in a constant current charging phase. The charging voltage interval is a value pre-set by a user, and the charging voltage interval is stored in the electronic apparatus. Preferably, the charging voltage interval is [3.85, 3.95] or may be other values, depending on the specific needs. If the charging voltage interval is [3.85, 3.95], a maximum charging voltage is 3.95 volts and a minimum charging voltage is 3.85 volts. In this embodiment, a difference between a maximum charging voltage and a minimum charging voltage in the charging voltage interval is less than or equal to 0.1 volts.

S22: Determine a charging current interval and a charging time interval based on the charging current, the charging voltage, and the charging time, where the charging current interval and the charging time interval correspond to the charging voltage interval.

In this embodiment, the voltage of the battery being estimated keeps increasing during the constant current charging phase, so determining a charging current interval and a charging time interval based on the charging current, the charging voltage, and the charging time may be intercepting data of a charging current interval and a charging time interval from the data of the charging current, the charging voltage, and the charging time.

S23: Obtain training features for model training, where the training features include training electrochemical features and training time domain features.

Figure 3:
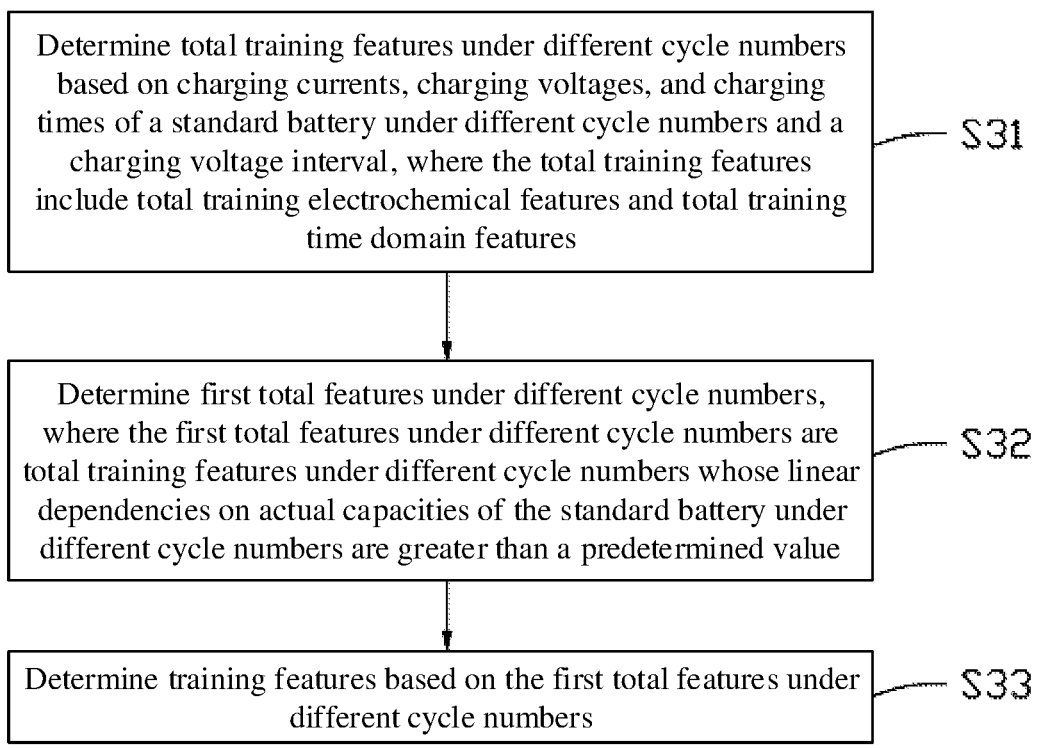
FIG. 3 is a flowchart of determining training features in the method for battery capacity estimation in FIG. 2.

The model is a Gaussian process regression model. As shown in FIG. 3, prior to the obtaining training features for model training, the method for battery capacity estimation further includes:

S31: Determine total training features under different cycle numbers based on charging currents, charging voltages, and charging times of a standard battery under different cycle numbers and the charging voltage interval, where the total training features include total training electrochemical features and total training time domain features.

The determining total training features under different cycle numbers based on charging currents, charging voltages, and charging times of a standard battery under different cycle numbers and the charging voltage interval includes:

b1: Obtain the charging currents, charging voltages, and charging times of the standard battery under different cycle numbers.

In this embodiment, each cycle refers to a complete charge and discharge cycle. Preferably, the cycle number is in the interval [20,200] or may be other values, depending on the specific needs.

The charging currents, charging voltages, and charging times under different cycle numbers of the standard battery may be stored in the electronic apparatus or in an external device. Then, the obtaining charging currents, charging voltages, and charging times of the standard battery under different cycle numbers may be obtaining the charging currents, charging voltages, and charging times of the standard battery under different cycle numbers from within the electronic apparatus, or obtaining the charging currents, charging voltages, and charging times of the standard battery under different cycle numbers from the external device.

b2: Determine charging current intervals and charging time intervals of the standard battery under different cycle numbers corresponding to the charging voltage interval based on the charging currents, charging voltages, and charging times of the standard battery under different cycle numbers.

b3: Calculate charged capacities of the standard battery based on charging currents in the charging current intervals of the standard battery and charging times in the charging time intervals of the standard battery.

In this embodiment, the calculating a charged capacity of the standard battery based on a charging current in the charging current interval of the standard battery and a charging time in the charging time interval of the standard battery includes calculating the charged capacity of the standard battery using a Coulomb integration method.

b4: Calculate capacity increment values based on charging voltages within the charging voltage interval of the standard battery and charged capacities corresponding to the charging voltages.

In this embodiment, the calculating capacity increment values based on charging voltages within the charging voltage interval of the standard battery and charged capacities corresponding to the charging voltages is differentiating charging voltages in the charging voltage interval of the standard battery and charged capacities corresponding to the charging voltages to calculate the capacity increment values.

b5: Plot capacity increment curves of the standard battery under different cycle numbers based on the charging voltages in the charging voltage interval of the standard battery and the capacity increment values.

In this embodiment, the capacity increment curves of the standard battery under different cycle numbers are plotted in the same coordinate system based on the charging voltages in the charging voltage interval of the standard battery and the capacity increment values. Here, different capacity increment curves represent different cycle numbers. The horizontal coordinate of the capacity increment curves of the standard battery under different cycle numbers is the charging voltage; the vertical coordinate of the capacity increment curves of the standard battery under different cycle numbers is the capacity increment value.

b6: Determine total training features under different cycle numbers based on the capacity increment curves of the standard battery under different cycle numbers and the charging current intervals and charging time intervals of the standard battery under different cycle numbers.

In this embodiment, prior to the determining total training features under different cycle numbers based on the capacity increment curves of the standard battery under different cycle numbers and the charging current intervals and charging time intervals of the standard battery under different cycle numbers, the method further includes: performing moving filtering and Gaussian filtering on the capacity increment curves of the standard battery under different cycle numbers.

The total training electrochemical features include activation energy increment, throughput, and charging time length; the total training time domain features include peak value, maximum value, mean value, variance, root mean square value, peak factor, kurtosis, kurtosis factor, waveform factor, pulse factor, margin factor, minimum value, and skewness factor.

In this embodiment, activation energy increments under different cycle numbers are determined according to equation $$E_S = \int_{T_{V_1}}^{T_{V_n}} V^2 dt.$$

Here, $E_S$ represents activation energy increments under different cycle numbers; $T_{V_1}$ represents minimum charging times in charging time intervals of the standard battery under different cycle numbers; $T_{V_n}$ represents maximum charging times in charging time intervals of the standard battery under different cycle numbers; V represents charging voltages in charging voltage intervals of the standard battery under different cycle numbers; t represents charging times in charging time intervals of the standard battery under different cycle numbers.

In this embodiment, throughputs under different cycle numbers are determined according to equation $$A_h = \int_{T_{V_1}}^{T_{V_n}} I dt.$$

Here, $A_h$ represents throughputs under different cycle numbers; $T_{V_1}$ represents minimum charging times in charging time intervals of the standard battery under different cycle numbers; $T_{V_n}$ represents maximum charging times in charging time intervals of the standard battery under different cycle numbers; I represents charging currents in charging current intervals of the standard battery under different cycle numbers; t represents charging times in charging time intervals of the standard battery under different cycle numbers.

In this embodiment, charging time lengths under different cycle numbers are determined according to equation $\Delta T = T_{V_n} - T_{V_1}$. Here, $\Delta T$ represents charging time lengths under different cycle numbers; $T_{V_n}$ represents maximum charging times in charging time intervals of the standard battery under different cycle numbers; $T_{V_1}$ represents minimum charging times in charging time intervals of the standard battery under different cycle numbers.

In this embodiment, peak values under different cycle numbers are determined according to equation Peak=max(|dQ/dV|). Here, Peak represents peak values under different cycle numbers; dQ/dV represents capacity increment values of the standard battery under different cycle numbers.

In this embodiment, maximum values under different cycle numbers are determined according to equation Max=max(dQ/dV). Here, Max represents maximum values under different cycle numbers; dQ/dV represents capacity increment values of the standard battery under different cycle numbers.

In this embodiment, mean values under different cycle numbers are determined according to equation $$\text{Mean} = \frac{1}{n} \sum_{i=1}^{n} dQ_i/dV_i.$$

Here, Mean represents mean values under different cycle numbers; n represents numbers of charging voltage samples in charging voltage intervals of the standard battery under different cycle numbers; i represents the i-th sample; $dQ_i/dV_i$ represents the i-th capacity increment values of the standard battery under different cycle numbers.

In this embodiment, variances under different cycle numbers are determined according to equation $$\text{Var} = \frac{1}{n-1} \sum_{i=1}^{n} (dQ_i/dV_i - \text{Mean})^2.$$

Here, Var represents variances under different cycle numbers; n represents numbers of charging voltage samples in charging voltage intervals of the standard battery under different cycle numbers; i represents the i-th sample; $dQ_i/dV_i$ represents the i-th capacity increment values of the standard battery under different cycle numbers; Mean represents mean values under different cycle numbers.

In this embodiment, root mean square values under different cycle numbers are determined according to equation $$\text{Rms} = \frac{1}{n} \sqrt{\sum_{i=1}^{n} dQ_i/dV_i^2}.$$

Here, Rms represents root mean square values under different cycle numbers; n represents numbers of charging voltage samples in charging voltage intervals of the standard battery under different cycle numbers; i represents the i-th sample; $dQ_i/dV_i$ represents the i-th capacity increment values of the standard battery under different cycle numbers.

In this embodiment, peak factors under different cycle numbers are determined according to equation $$CF = \frac{\text{Peak}}{\text{Rms}}.$$

Here, CF represents peak factors under different cycle numbers; Peak represents maximum values under different cycle numbers; Rms represents root mean square values under different cycle numbers.

In this embodiment, kurtosis values under different cycle numbers are determined according to equation $$Kur = \frac{1}{n} \sum_{i=1}^{n} (dQ_i/dV_i)^4.$$

Here, Kur represents kurtoses under different cycle numbers; n represents numbers of charging voltage samples in charging voltage intervals of the standard battery under different cycle numbers; i represents the i-th sample; $dQ_i/$ $dV_i$ represents the i-th capacity increment values of the standard battery under different cycle numbers.

In this embodiment, kurtosis factors under different cycle numbers are determined according to equation $$KF = \frac{Kur}{Rms^4}.$$

Here, KF represents kurtosis factors under different cycle numbers; Kur represents kurtoses under different cycle numbers; Rms represents root mean square values under different cycle numbers.

In this embodiment, waveform factors under different cycle numbers are determined according to equation $$FF = \frac{Rms}{|Mean|}.$$

Here, FF represents waveform factors under different cycle numbers; Rms represents root mean square values under different cycle numbers; Mean represents mean values under different cycle numbers.

In this embodiment, pulse factors under different cycle numbers are determined according to equation $$IF = \frac{Peak}{Mean}.$$

Here, IF represents pulse factors under different cycle numbers; Peak represents maximum values under different cycle numbers; Mean represents mean values under different cycle numbers.

In this embodiment, margin factors under different cycle numbers are determined according to equation $$MF = Peak / \left(\frac{1}{n}\sum_{i=1}^{n}\sqrt{|dQ_i/dV_i|}\right)^2.$$

Here, MF represents margin factors under different cycle numbers; Peak represents maximum values under different cycle numbers; n represents numbers of charging voltage samples in charging voltage intervals of the standard battery under different cycle numbers; i represents the i-th sample; $dQ_i/dV_i$ represents the i-th capacity increment values of the standard battery under different cycle numbers.

In this embodiment, minimum values under different cycle numbers are determined according to equation Min=min(|dQ/dV|). Here, Min represents minimum values under different cycle numbers; dQ/dV represents capacity increment values of the standard battery under different cycle numbers.

In this embodiment, skewness factors under different cycle numbers are determined according to equation $$SF = \frac{\sqrt{n(n-1)}\frac{1}{n}\sum_{i=1}^{n}(dQ_i/dV_i - Mean)^3}{n(n-2)\left(\frac{1}{n}\sum_{i=1}^{n}(dQ_i/dV_i - Mean)^2\right)^{3/2}}.$$

Here, SF represents skewness factors under different cycle numbers. n represents numbers of charging voltage samples in charging voltage intervals of the standard battery under different cycle numbers; i represents the i-th sample; $dQ_i/dV_i$ represents the i-th capacity increment values of the standard battery under different cycle numbers; Mean represents mean values under different cycle numbers.

S32: Determine first total features under different cycle numbers, where the first total features under different cycle numbers are total training features under different cycle numbers whose linear correlations on actual capacities of the standard battery under different cycle numbers are greater than a predetermined value.

In this embodiment, the actual capacity may be an actual capacity calculated by another system within the electronic apparatus, or may be an actual capacity calculated by another apparatus outside the electronic apparatus, or may be an actual capacity calculated using any method known.

In this embodiment, linear correlations of the total training features under different cycle numbers on the actual capacities of the standard battery under different cycle numbers are determined according to equation $$r_k = \frac{\sum_{i=1}^{N}(X_i - \overline{X})(Y_i - \overline{Y})}{\sqrt{\sum_{i=1}^{N}(X_i - \overline{X})^2}\sqrt{\sum_{i=1}^{N}(Y_i - \overline{Y})^2}}.$$

Here, $r_k$ represents linear correlations of values of the k-th feature under different cycle numbers on actual capacities under the cycle numbers; i represents the i-th of the total number of values of the k-th feature or total number of actual capacities under different cycle numbers; N represents the total number of values of the k-th feature total number of actual capacities under different cycle numbers; $X_i$ represents a value of the k-th feature under the i-th cycle number; $\hat{X}$ represents a mean value of the k-th feature under all cycle numbers; $Y_i$ represents an actual capacity of the k-th feature under the i-th cycle number; $\hat{Y}$ represents a mean value of actual capacities of the k-th feature under all cycle numbers.

Preferably, the predetermined value may be 0.8 or other values depending on the specific needs.

Figure 4:
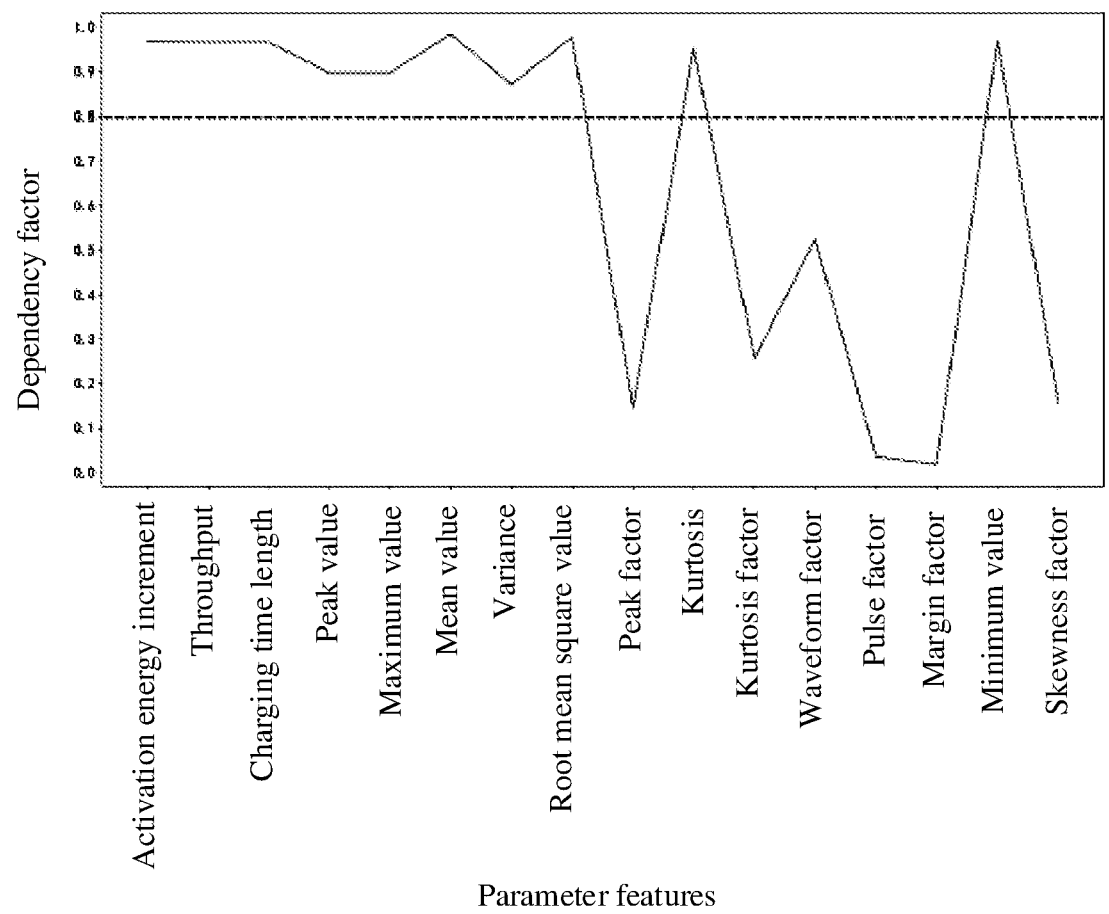
FIG. 4 is a curve chart showing linear correlations of total training features under different cycle numbers on actual capacities of a standard battery under different cycle numbers.

As shown in FIG. 4, FIG. 4 shows linear correlations of the activation energy increment, throughput, charging time length, peak value, maximum value, mean value, variance, root mean square value, peak factor, kurtosis, kurtosis factor, waveform factor, pulse factor, margin factor, minimum value, and skewness factor. Here, the linear correlations of the activation energy increment, throughput, charging time length, peak value, maximum value, mean value, variance, root mean square value, kurtosis, and minimum value are greater than 0.8. Then, the first total features under different cycle numbers, that is, the total training features under different cycle numbers with linear correlations on actual capacities of the standard battery under different cycle numbers greater than the predetermined value, include features of the activation energy increment, throughput, charging time length, peak value, maximum value, mean value, variance, root mean square value, kurtosis, and minimum value under different cycle numbers.

S33: Determine the training features based on the first total features under different cycle numbers.

In this embodiment, prior to the determining the training features based on the first total features under different cycle numbers, the method for battery capacity estimation further includes:

transforming the total training features under different cycle numbers into second total features under different cycle numbers using principal component analysis (Principal Component Analysis, PCA).

The determining the training features based on the first total features under different cycle numbers includes:
- c1: Determine common features between the first total features under different cycle numbers and the second total features under different cycle numbers as third total features under different cycle numbers.
- c2: Determine the training features for model training to be the third total features.

In this embodiment, the method for battery capacity estimation further includes:
training the model using the training features.

In this embodiment, prior to the training the model using the training features, the method for battery capacity estimation further includes:
standardizing the training features to form first eigenvectors under different cycle numbers.

The training the model using the training features includes:
- d1: Select randomly first eigenvectors under a first preset quantity of cycles from first eigenvectors under the different cycle numbers.
- d2: Train the model using the first eigenvectors selected to obtain initial parameters of the model, where the first eigenvectors selected are input variables of the model, and actual capacities corresponding to the first eigenvectors selected are output variables of the model.

Preferably, the first preset quantity may be any value in the interval [15, 20] or other values, depending on the specific needs. Preferably, a covariance function of the model is a linear kernel function $K(x,y)=\theta^2 x^T y$ or other functions, depending on the specific needs.

In this embodiment, with a given input $y=f(x)+\varepsilon$, $\varepsilon \sim N(0, \sigma_n^2)$ to the model, a distribution about the function $f(x)$ is obtained, that is, x.

Here, $\varepsilon$ represents an observed value of interference by noise, which is normally distributed with a mean value of 0 and a variance of $\sigma_n^2$.

The set formed by observed values of y obeys a Gaussian distribution, that is, a priori distribution model $y \sim N(\mu, Var(x)+\sigma_n^2 I)$.

Here, Var(x) is a covariance matrix of n×n, and the (i,j)-th element is a linear kernel function, that is, $Var(x_i,x_j)=\theta^2 x_i^T x_j$.

In this embodiment, a stochastic gradient descent method is used to iteratively update the parameter θ in the likelihood function to obtain optimal parameter to train the model. The likelihood function has the following form:

$$L(\theta)=-\frac{1}{2}\log|Var(x)+\sigma_m^2 I|-\frac{1}{2}(y-\mu)^T(K(x,x)+\sigma_m^2 I)^{-1}(y-\mu_x)-2n\log 2\pi.$$

Here, θ represents parameters of the model; x represents training data; Var(x) represents a n x n covariance matrix; a represents the variance of noise; I represents a unit matrix; K represents a kernel function; and n represents the number of data in a training set. In this embodiment, if x represents the first eigenvectors selected, θ represents initial parameters of the model.

According to theorems and priori distribution models obtained, corresponding posterior distribution models can be obtained as $f' \sim g(m(X),K(X))$, $m(X)=\mu_X+K(X,x)_T(K(x,x)+\sigma_n^2 I)^{-1}(y-\mu_x)$, and $K(X)=(K(X,X)+\sigma_n^2 I)-K(X,x)^T(K(x,x)+\sigma_n^2 I)^{-1}K(x,X)$.

Here, X and x represent different inputs; K represents the kernel function; σ represents the variance of noise; I represents the unit matrix; and y represents the output value.

Figure 5:
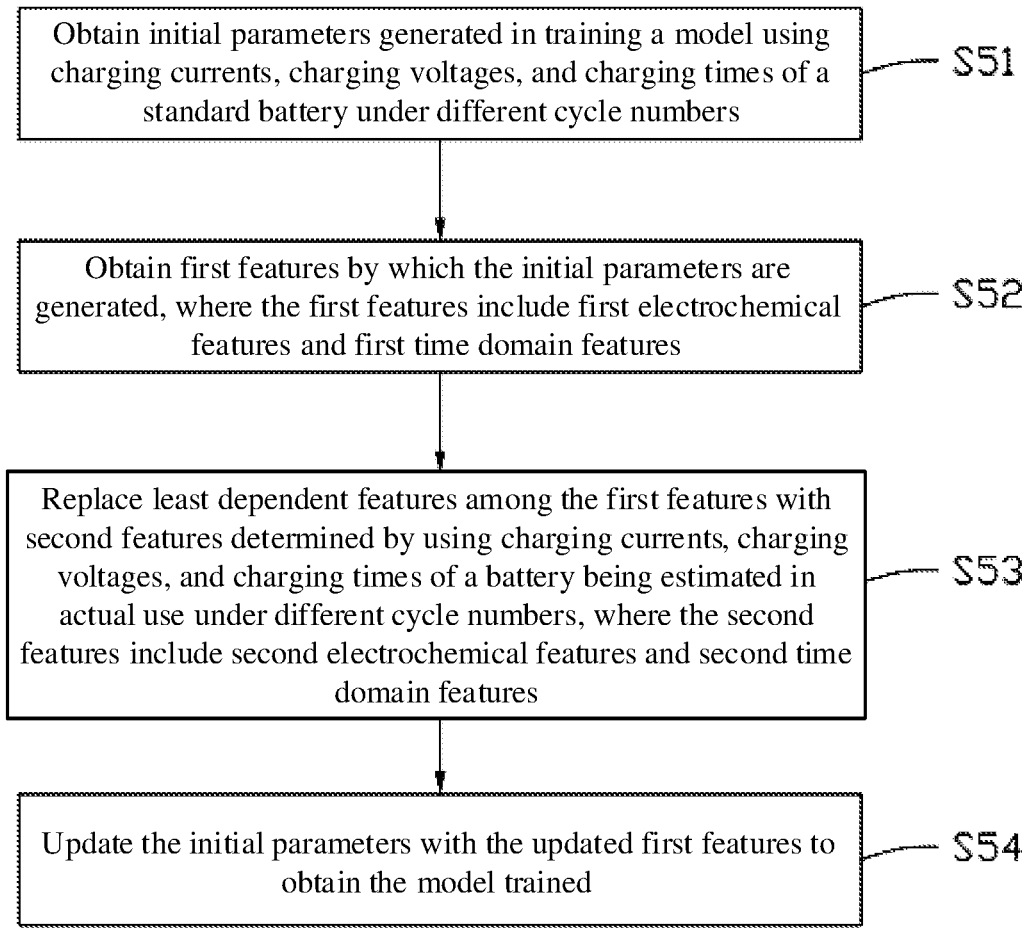
FIG. 5 is a flowchart of obtaining a trained model by updating initial parameters in the method for battery capacity estimation in FIG. 2.

As shown in FIG. 5, to adjust model parameters, the method for battery capacity estimation further includes:
- S51: Obtain initial parameters generated in training the model using charging currents, charging voltages, and charging times of a standard battery under different cycle numbers.

The initial parameters are initial parameters generated in training the model using the first eigenvectors selected.
- S52: Obtain first features by which the initial parameters are generated, where the first features include first electrochemical features and first time domain features.
- S53: Replace least dependent features among the first features with second features determined by using charging currents, charging voltages, and charging times of the battery being estimated in actual use under different cycle numbers, where the second features include second electrochemical features and second time domain features.

The obtaining first features by which the initial parameters are generated includes: obtaining first features by which the initial parameters are generated under a first quantity of cycle numbers. In this embodiment, the first quantity is the randomly selected first preset quantity. The first features are features with linear correlations greater than the predetermined value that have gone through principal component analysis. Types of the first features are, for example, the activation energy increment, charging time length, peak value, maximum value, mean value, variance, root mean square value, and kurtosis.

Figure 6:
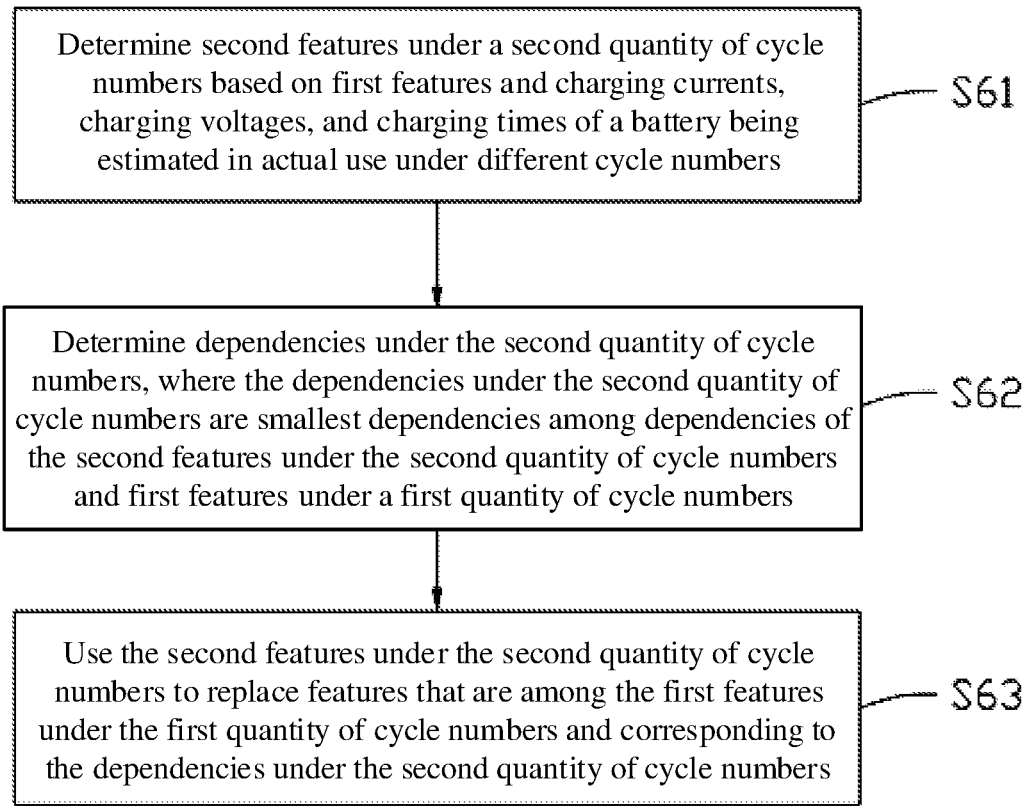
FIG. 6 is a flowchart of replacing least dependent features among first features with second features determined by using charging currents, charging voltages, and charging times of a battery being estimated in actual use under different cycle numbers as in FIG. 5.

As shown in FIG. 6, the replacing least dependent features among the first features with second features determined by using charging currents, charging voltages, and charging times of the battery being estimated in actual use under different cycle numbers includes:
- S61: Determine second features under a second quantity of cycle numbers based on the first features and the charging currents, charging voltages, and charging times of the battery being estimated in actual use under different cycle numbers.

The determining second features under a second quantity of cycle numbers based on the first features and the charging currents, charging voltages, and charging times of the battery being estimated in actual use under different cycle numbers includes:
- g1: Obtain the charging currents, charging voltages, and charging times of the battery being estimated in actual use under different cycle numbers.
- g2: Determine charging current intervals and charging time intervals of the battery being estimated in actual use under different cycle numbers corresponding to the charging voltage interval based on the charging currents, charging voltages, and charging times of the battery being estimated in actual use under different cycle numbers.
- g3: Calculate charged capacities of the battery being estimated under different cycle numbers based on charging currents in the charging current intervals of the battery being estimated under different cycle numbers and charging times in the charging time intervals of the battery being estimated under different cycle numbers.

In this embodiment, the calculating charged capacities of the battery being estimated under different cycle numbers based on charging currents in the charging current intervals of the battery being estimated under different cycle numbers and charging times in the charging time intervals of the battery being estimated under different cycle numbers includes calculating the charged capacities of the battery being estimated under different cycle numbers using the Coulomb integration method.

g4: Calculate capacity increment values based on charging voltages within the charging voltage interval of the battery being estimated and charged capacities corresponding to the charging voltages.

In this embodiment, the calculating capacity increment values based on charging voltages within the charging voltage interval of the battery being estimated under different cycle numbers and charged capacities corresponding to charging voltages is differentiating charging voltages in charging voltage intervals of the battery being estimated under different cycle numbers and charged capacities corresponding to the charging voltages to calculate the capacity increment values.

g5: Plot capacity increment curves of the battery being estimated under different cycle numbers based on charging voltages in the charging voltage intervals of the battery being estimated under different cycle numbers and the capacity increment values.

In this embodiment, the capacity increment curves of the battery being estimated under different cycle numbers are plotted in the same coordinate system based on charging voltages in the charging voltage intervals of the battery being estimated under different cycle numbers and the capacity increment values. The horizontal coordinate of the capacity increment curves of the battery being estimated under different cycle numbers is the charging voltage; the vertical coordinate of the capacity increment curves of the battery being estimated under different cycle numbers is the capacity increment value.

g6: Determine third features under different cycle numbers based on the first features, the capacity increment curves of the battery being estimated under different cycle numbers and the charging current intervals and charging time intervals of the battery being estimated under different cycle numbers, where the third features include third electrochemical features and third time domain features.

In this embodiment, the third features are of the same types as the first features. For example, the first features include activation energy increment, charging time length, peak value, maximum value, mean value, variance, root mean square value, and kurtosis. Then, activation energy increments, charging time lengths, peak values, maximum values, mean values, variances, root mean square values, and kurtoses under different cycle numbers are calculated based on the capacity increment curves of the battery being estimated under different cycle numbers and the charging current intervals and charging time intervals of the battery being estimated under different cycle numbers.

g7: Select randomly second features under a second preset quantity of cycle numbers from the third features under the cycle numbers.

In this embodiment, the second preset quantity is less than the first preset quantity.

S62: Determine correlations under the second quantity of cycle numbers, where the correlations under the second quantity of cycle numbers are smallest correlations among correlations of the second features under the second quantity of cycle numbers and the first features under the first quantity of cycle numbers.

In this embodiment, prior to the determining correlations under the second quantity of cycle numbers, where the correlations under the second quantity of cycle numbers are smallest correlations among correlations of the second features under the second quantity of cycle numbers and the first features under the first quantity of cycle numbers, the method for battery capacity estimation further includes:

standardizing the second features under the second quantity of cycle numbers to form second eigenvectors under the second quantity of cycle numbers.

In this embodiment, the determining correlations under the second quantity of cycle numbers, where the correlations under the second quantity of cycle numbers are small correlations among correlations of the second features under the second quantity of cycle numbers and the first features under the first quantity of cycle numbers includes:

h1: Determine the correlations of the second eigenvectors under each cycle number and the first eigenvectors under each cycle number according to equation $r_{ab}=$ $$\frac{\sum_{i=1}^{P}(P_i-\overline{P})(Q_i-\overline{Q})}{\sqrt{\sum_{i=1}^{P}(P_i-\overline{P})^2}\sqrt{\sum_{i=1}^{P}(Q_i-\overline{Q})^2}}.$$

Here, $r_{ab}$ represents the linear correlations of values of the second eigenvectors under the a-th cycle number and values of the first eigenvectors under the b-th cycle number. i represents the i-th of the total number of values of the second eigenvectors or first eigenvectors under each cycle number. P represents the total number of values of the second eigenvector or first eigenvector under each cycle number. $P_i$ represents value of the i-th second eigenvector under the a-th cycle number. $\overline{P}$ represents a mean value of the i-th second eigenvector under all cycle numbers. $Q_i$ represents value of the i-th first eigenvector under the b-th cycle number. $\overline{Q}$ represents a mean value of the i-th first eigenvector under all cycle numbers.

h2: Arrange the correlations into a matrix with the second quantity of rows and the first quantity of columns.

For example, the first quantity is M and the second quantity is K. Then, the correlations are arranged into a matrix $$\begin{bmatrix} r_{11} & \cdots & r_{1M} \\ \vdots & \ddots & \vdots \\ r_{1M} & \cdots & r_{KM} \end{bmatrix}.$$

h3: Calculate a total value of each column in the matrix.

In this embodiment, $r_{11} \ldots r_{1M}$ is column 1 and $r_{1M} \ldots r_{KM}$ is column K. The calculating a total value of each column in the matrix may include, for example, calculating a total value $r_1$ of column 1, calculating a total value $r_2$ column 2, ..., and calculating a total value $r_K$ of column K. The calculating a total value $r_1$ of column 1 may be, for example, calculating the total value $r_1$ of column 1 according to equation $r_1=r_{11}+r_{12}+\ldots+r_{1M}$, where $r_1$ is the total value of column 1, $r_{11}$ is a dependency at row 1 column 1, $r_{12}$ is a dependency at row 2 column 1, and $r_{1M}$ is a dependency at row M column 1.

h4: Determine the second quantity of smallest values among the total values.

The determining the second quantity of smallest values among the total values includes:

I1: Sort the total values in a preset order, where the preset order includes an ascending or a descending order.

I2: Determine the second quantity of smallest values among the total values based on the total values sorted.

For example, the total values sorted are 8, 7.5, 7.3, ..., 5.6, 5.3, 4.9, and the second quantity is 3. Then the second quantity of smallest values are 5.6, 5.3, and 4.9.

h5: Determine smallest correlations under the second quantity of cycle numbers based on the second quantity of smallest values.

For example, the second quantity of smallest values are the total value of column 1, the total value of column 5, and the total value of column 8. Then the smallest correlations under the second quantity of cycle numbers are a dependency under the 1st cycle number, a dependency under the 5th cycle number, and a dependency under the 8th cycle number among the first quantity of cycle numbers.

S63: Use the second features under the second quantity of cycle numbers to replace features that are among the first features under the first quantity of cycle numbers and corresponding to the correlations under the second quantity of cycle numbers.

S54: Update the initial parameters with the updated first features to obtain the model trained.

In this embodiment, the model is trained with the updated first features under the first quantity of cycle numbers to update the initial parameters and thus obtain the model trained, where the updated first features under the first quantity of cycle numbers are input variables of the model, and actual capacities corresponding to the updated first features under the first quantity of cycle numbers are output variables of the model. S24: Determine actual features of the battery being estimated based on the charging voltage interval, the charging current interval, the charging time interval, and the training features.

Figure 7:
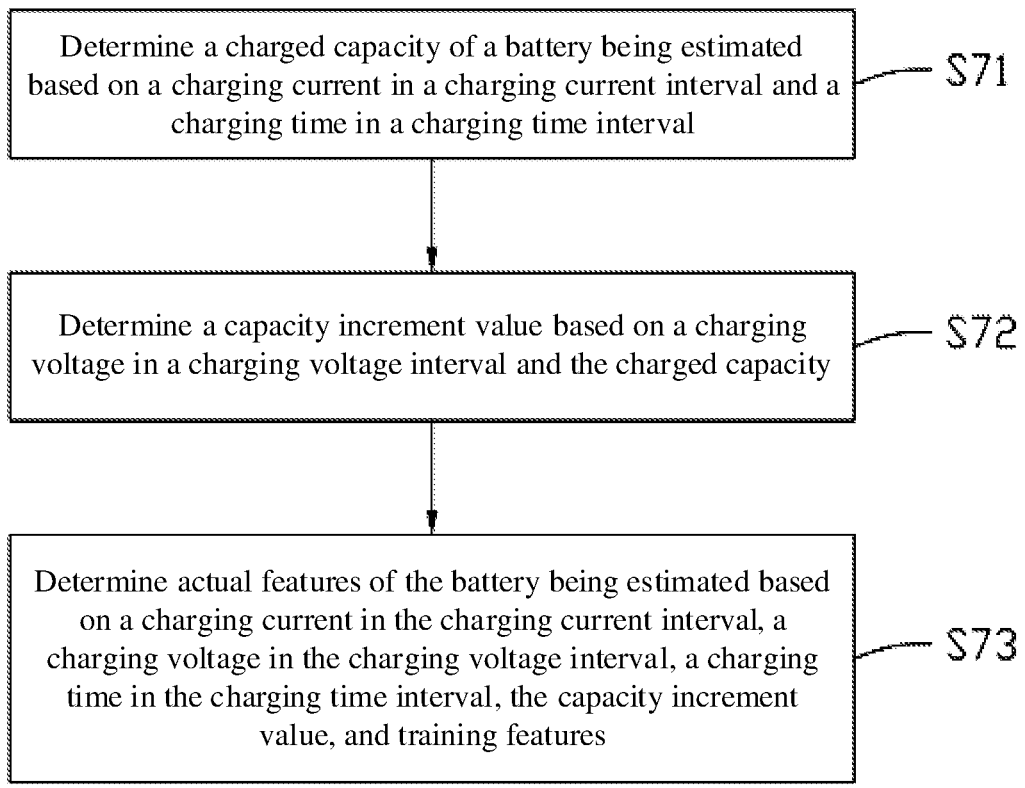
FIG. 7 is a flowchart of determining actual features of the battery being estimated based on a charging voltage interval, a charging current interval, a charging time interval, and training features as in FIG. 2.

As shown in FIG. 7, the determining actual features of the battery being estimated based on the charging voltage interval, the charging current interval, the charging time interval, and the training features includes:

S71: Determine a charged capacity of the battery being estimated based on a charging current in the charging current interval and a charging time in the charging time interval.

In this embodiment, the determining a charged capacity of the battery being estimated based on a charging current in the charging current interval and a charging time in the charging time interval includes determining the charged capacity of the battery being estimated using the Coulomb integration method.

S72: Determine a capacity increment value based on a charging voltage in the charging voltage interval and the charged capacity.

In this embodiment, the determining a capacity increment value based on a charging voltage in the charging voltage interval and the charged capacity is determining the capacity increment value by differentiating charging voltages in the charging voltage interval and charged capacities corresponding to the charging voltages.

S73: Determine the actual features of the battery being estimated based on a charging current in the charging current interval, a charging voltage in the charging voltage interval, a charging time in the charging time interval, the capacity increment value, and the training features.

In this embodiment, types of the actual features of the battery being estimated are the same as the types of the training features.

S25: Estimate, based on the model and the actual features, an actual capacity of the battery being estimated.

In this embodiment, the actual features are input to a posterior distribution model of the model trained to output an estimated mean value and an estimated confidence interval of the actual capacity of the battery being estimated. In this application, both the estimated mean value and estimated confidence interval of the actual capacity of the battery being estimated are output. Therefore, the confidence level of the estimated mean value can be determined, providing more information for the determination of the actual capacity of the battery being estimated.

According to this application, the actual capacity of the battery being estimated is estimated based on the data corresponding to the charging voltage interval, the actual features, and the model. Thus, the capacity of the battery being estimated can be estimated using a model with the use of a small amount of data, reducing the amount of data required and shortening the estimation time. Besides, to train the model, only training features generated from the data of a standard battery under different cycle numbers corresponding to a charging voltage interval need to be used, reducing the amount of training data and shortening the training time. In addition, the model can be updated as needed during actual use, which can improve the accuracy of estimation of the capacity of the battery being estimated.

Referring still to FIG. 1, in this embodiment, the memory 11 may be an internal memory of the electronic apparatus, that is, a memory built in the electronic apparatus. In other embodiments, the memory 11 may instead be an external memory of the electronic apparatus, that is, a memory externally connected to the electronic apparatus.

In some embodiments, the memory 11 stores program code and various data and completes high-speed and automatic access to the program or data during operation of the electronic apparatus.

The memory 11 may include a random access memory and may also include a non-volatile memory such as a hard disk, memory, plug-in hard disk, smart media card (Smart Media Card, SMC), secure digital (Secure Digital, SD) card, flash card (Flash Card), or at least one disk memory device, flash memory device, or other volatile solid state memory device.

In one embodiment, the processor 12 may be a central processing unit (Central Processing Unit, CPU) or other general-purpose processor, a digital signal processor (Digital Signal Processor, DSP), an application-specific integrated circuit (Application Specific Integrated Circuit, ASIC), a field-programmable gate array (Field-Programmable Gate Array, FPGA) or other programmable logic device, a discrete gate or transistor logic device, a discrete hardware component, or the like. The general-purpose processor may be a microprocessor or any other conventional processor or the like. In an embodiment, the processor 12 may also be one or more of CPU and MCU (Microcontroller Unit, Microprocessor). In this embodiment, the processor 12 includes a CPU 121 and an MCU 122. The CPU 121 is used to control and process all applications of the electronic apparatus 100. The CPU 121 includes at least one MCU 122. The MCU 122 is used to process a management program of the battery 13 to achieve management functions, for example, estimation of the capacity of the battery 13.

When realized in form of a software functional unit and sold or used as a separate product, the program code and various data in the memory 11 may be stored in a computer-readable storage medium. Based on such an understanding, in this application, all or some of the processes in the method of the above embodiments, for example, the steps in the method for battery capacity estimation, may also be accomplished by a computer program instructing relevant hardware. The computer program may be stored in a computer readable storage medium, and the computer program, when executed by the MCU, can implement the steps of the above method embodiments. The computer program includes computer program code. The computer program code may be in the form of source code, object code, or an executable file or in some intermediate forms or the like. The computer-readable medium may include any entity or means capable of carrying the computer program code, a recording medium, a USB flash drive, a removable hard disk, a magnetic disk, an optical disc, a computer memory, a read-only memory (ROM, Read-Only Memory), or the like. In an embodiment, the memory 11 is one or more of ROM, RAM (Random Access Memory, random access memory), or FLASH (flash memory). In this embodiment, the memory 11 may include a ROM 111, a RAM 112 and a FLASH 113. The ROM 111 may be used to store an algorithm program of the method for battery capacity estimation. Permanent data may also be stored in the ROM 111. The permanent data may include important information such as identity, password, and the like. The algorithm program and the permanent data share a storage space in the ROM 111. The storage space in the ROM 111 is managed in a partitioning manner. The RAM 112 may be used for storing functions and variables of the method for battery capacity estimation. The FLASH 113 may be used to store the algorithm program, functions and variables of the method for battery capacity estimation.

It can be understood that the module division described above is a logical functional division, and other division manners may be used in actual implementation. In addition, function modules in the embodiments of this application may be integrated into one processing unit, or each of the modules may exist alone physically, or two or more modules may be integrated into one unit. The integrated module may be implemented either in the form of hardware or in the form of hardware plus software function modules.

It is apparent to those skilled in the art that this application is not limited to the details of the above illustrative embodiments and that this application can be implemented in other specific forms without departing from the spirit or essential features of this application. Therefore, from whatever point of view, the above embodiments of this application should be regarded as illustrative and non-limiting, and the scope of this application is defined by the appended claims but not the above descriptions, and thus all variations falling within the meaning and scope of equivalent elements of the claims of this application are intended to be incorporated into this application.

It is apparent to those skilled in the art that this application is not limited to the details of the above illustrative embodiments and that this application can be implemented in other specific forms without departing from the spirit or essential features of this application. Therefore, from whatever point of view, the above embodiments of this application should be regarded as illustrative and non-limiting, and the scope of this application is defined by the appended claims but not the above descriptions, and thus all variations falling within the meaning and scope of equivalent elements of the claims of this application are intended to be incorporated into this application.

What is claimed is:

1. A method for battery capacity estimation of a battery, wherein the method comprises:
    obtaining a charging current, a charging voltage, a charging time, and a charging voltage interval of the battery;
    determining a charging current interval and a charging time interval based on the charging current, the charging voltage, and the charging time, wherein the charging current interval and the charging time interval correspond to the charging voltage interval;
    obtaining training features for training a model, wherein the training features comprise training electrochemical features and training time domain features;
    determining actual features of the battery based on the charging voltage interval, the charging current interval, the charging time interval, and the training features, wherein the actual features comprise actual electrochemical features and actual time domain features; and
    estimating, based on the model and the actual features, an actual capacity of the battery.

2. The method for battery capacity estimation according to claim 1, wherein the model is a Gaussian process regression model.

3. The method for battery capacity estimation according to claim 1, wherein a difference between a maximum charging voltage and a minimum charging voltage in the charging voltage interval is less than or equal to 0.1 volts.

4. The method for battery capacity estimation according to claim 1, wherein the determining actual features of the battery based on the charging voltage interval, the charging current interval, the charging time interval, and the training features, comprises:
    determining a charged capacity of the battery based on a charging current in the charging current interval and a charging time in the charging time interval;
    determining a capacity increment value based on a charging voltage in the charging voltage interval and the charged capacity; and
    determining the actual features of the battery based on the charging current in the charging current interval, the charging voltage in the charging voltage interval, the charging time in the charging time interval, the capacity increment value, and the training features.

5. The method of battery capacity estimation according to claim 1, wherein prior to the obtaining training features for model training, the method further comprises:
    determining total training features under different cycles based on charging currents, charging voltages, and charging times of a standard battery under the different cycles and the charging voltage interval, wherein the total training features comprise total training electrochemical features and total training time domain features;
    determining first total features under the different cycles, wherein the first total features under different cycles are the total training features under the different cycles whose linear correlations on actual capacities of the standard battery under the different cycles are greater than a predetermined value; and
    determining the training features based on the first total features under the different cycles.

6. The method of battery capacity estimation according to claim 5, wherein the total training electrochemical features comprise an activation energy increment, a throughput, and a charging time duration; the total training time domain features comprise a peak value, a maximum value, a mean value, a variance, a root mean square value, a peak factor, a kurtosis, a kurtosis factor, a waveform factor, a pulse factor, a margin factor, a minimum value, and a skewness factor.

7. The method of battery capacity estimation according to claim 5, wherein prior to the determining the training features based on the first total features under the different cycles, the method further comprises:

transforming the total training features under the different cycles into second total features under the different cycles using a principal component analysis; and the determining the training features based on the first total features under the different cycles comprises:

determining common features between the first total features under the different cycles and the second total features under the different cycles as third total features under the different cycles; and determining the training features for model training to be the third total features.

8. The method of battery capacity estimation according to claim 5, wherein, the determining total training features under different cycles based on charging currents, charging voltages, and charging times of a standard battery under different cycles and the charging voltage interval comprises:

obtaining the charging currents, charging voltages, and charging times of the standard battery under different cycles;

determining charging current intervals and charging time intervals of the standard battery under different cycles corresponding to the charging voltage interval based on the charging currents, charging voltages, and charging times of the standard battery under different cycles;

calculating charged capacities of the standard battery based on charging currents in the charging current intervals of the standard battery and charging times in the charging time intervals of the standard battery;

calculating capacity increment values based on charging voltages within the charging voltage interval of the standard battery and charged capacities corresponding to the charging voltages;

plotting capacity increment curves of the standard battery under different cycles based on the charging voltages in the charging voltage interval of the standard battery and the capacity increment values;

determining total training features under different cycles based on the capacity increment curves of the standard battery under different cycles and the charging current intervals and charging time intervals of the standard battery under different cycles.

9. The method for battery capacity estimation according to claim 1, wherein the method further comprises:

obtaining initial parameters generated in training the model using charging currents, charging voltages, and charging times of a standard battery under different cycles;

obtaining first features by which the initial parameters are generated, wherein the first features comprise first electrochemical features and first time domain features;

replacing least dependent features among the first features with second features determined by using charging currents, charging voltages, and charging times of the battery in actual use under different cycles, wherein the second features comprise second electrochemical features and second time domain features; and updating the initial parameters with the updated first features to obtain the model trained.

10. The method for battery capacity estimation according to claim 9, wherein:

the obtaining the first features by which the initial parameters are generated comprises:

obtaining first features by which the initial parameters are generated under a first quantity of cycles;

the replacing least dependent features among the first features with second features determined by using charging currents, charging voltages, and charging times of the battery in actual use under different cycles comprises:

determining second features under a second quantity of cycles based on the first features and the charging currents, charging voltages, and charging times of the battery in actual use under the different cycles;

determining correlations under the second quantity of cycles, wherein the correlations under the second quantity of cycles are smallest correlations among correlations of the second features under the second quantity of cycles and the first features under the first quantity of cycles; and using the second features under the second quantity of cycles to replace features that are among the first features under the first quantity of cycles and corresponding to the correlations under the second quantity of cycles.

11. The method for battery capacity estimation according to claim 10, wherein, the determining correlations under the second quantity of cycles, wherein the correlations under the second quantity of cycles are smallest correlations among correlations of the second features under the second quantity of cycles and the first features under the first quantity of cycles, comprises:

determining the correlations of second eigenvectors under each cycle and first eigenvectors under each cycle according to equation $$r_{ab} = \frac{\sum_{i=1}^{P}(P_i - \overline{P})(Q_i - \overline{Q})}{\sqrt{\sum_{i=1}^{P}(P_i - \overline{P})^2}\sqrt{\sum_{i=1}^{P}(Q_i - \overline{Q})^2}},$$

wherein $r_{ab}$ represents linear correlations of values of the second eigenvectors under an a-th cycle number and values of the first eigenvectors under a b-th cycle number, i represents i-th of a total number of values of the second eigenvectors or first eigenvectors under each cycle number, P represents a total number of values of the second eigenvector or first eigenvector under each cycle number, $P_i$ represents value of the i-th second eigenvector under the a-th cycle number, p represents a mean value of the i-th second eigenvector under all cycle numbers, $Q_i$ represents a value of the i-th first eigenvector under the b-th cycle number, and $\overline{Q}$ represents a mean value of the i-th first eigenvector under all cycle numbers;

arranging the correlations into a matrix with the second quantity of rows and the first quantity of columns;

calculating a total value of each column in the matrix;

determining the second quantity of smallest values among the total values;

determining smallest correlations under the second quantity of cycles based on the second quantity of smallest values.

12. The method for battery capacity estimation according to claim 1, wherein the method further comprises:

training the model using the training features, wherein the training the model using the training features comprises:

selecting randomly first eigenvectors under a first preset quantity of cycles from first eigenvectors under the different cycles;

training the model using the first eigenvectors selected to obtain initial parameters of the model, wherein the first eigenvectors selected are input variables of the model, and actual capacities corresponding to the first eigenvectors selected are output variables of the model.

13. An electronic apparatus, wherein the electronic apparatus comprises:
   a battery;
   a processor; and
   a memory, wherein the memory stores a plurality of program modules, and the plurality of program modules are loaded by the processor to execute the method for battery capacity estimation according to claim 1.

14. The electronic apparatus according to claim 13, wherein:
   the battery is a lithium-ion polymer battery;
   the processor is one or more of CPU and MCU;
   the memory is one or more of ROM, RAM, and FLASH.

15. A non-transitory storage medium, having at least one computer instruction stored thereon, wherein the instruction is loaded by a processor to execute the method for battery capacity estimation according to claim 1.

* * * * *